(12) United States Patent
Baur et al.

(10) Patent No.: US 6,725,171 B2
(45) Date of Patent: Apr. 20, 2004

(54) SELF-TEST WITH SPLIT, ASYMMETRIC CONTROLLED DRIVER OUTPUT STAGE

(75) Inventors: Ulrich Baur, Weil im Schoenbuch (DE); Otto Andreas Torreiter, Leinfelden-Echt (DE); Joseph Eckelman, Hopewell Junction, NY (US); David TinSun Hui, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,925

(22) Filed: Nov. 1, 2001

(65) Prior Publication Data

US 2002/0078400 A1 Jun. 20, 2002

(30) Foreign Application Priority Data

Nov. 1, 2000 (EP) .............................................. 00123769

(51) Int. Cl.[7] .......................... G01R 31/00; G01R 31/26
(52) U.S. Cl. ......................... 702/117; 702/58; 324/763; 324/765
(58) Field of Search ........................ 326/16; 324/73.1, 324/763, 765, 537; 702/117–120, 57, 58, 64, 65; 327/434, 437

(56) References Cited

U.S. PATENT DOCUMENTS 5,796,260 A * 8/1998 Agan ........................... 324/537
6,348,811 B1 * 2/2002 Haycock et al. .............. 326/16

* cited by examiner

*Primary Examiner*—Marc S. Hoff
*Assistant Examiner*—Manuel L Barbee
(74) *Attorney, Agent, or Firm*—Anthony J. Canale

(57) ABSTRACT

The present invention relates to a method and system for full parametric testing of the drive and receive capability of bi-directional driver/receiver-stages, and in particular of bi-directional input/output-stages of a semiconductor chip. Electrical properties, as for example DC-resistance, AC-impedance of a driver stage are tested by at least one test load implemented on the chip itself which causes a characteristic voltage drop usable for test evaluation. Advantageously, the output stage devices of P-type (50, 52) and N-type (54, 56), respectively, are split into at least two sub-devices P1, P2 and N1, N2, and are controlled separately by a control logic (60, 62, 64, 70, 72, 74). Then, for example N2 is used for testing the P device, and P2 is used for testing the N-device. Thus, devices already present on the chip are re-used for test purposes, which makes off-chip testing unnecessary.

9 Claims, 2 Drawing Sheets

(a)

(b)

SELF-TEST WITH SPLIT, ASYMMETRIC CONTROLLED DRIVER OUTPUT STAGE

FIELD OF THE INVENTION

The present invention relates to a method and system for full parametric testing of the drive and receive capability of bi-directional driver/receiver-stages, and in particular of bi-directional input/output-stages of a semiconductor chip.

BACKGROUND OF THE INVENTION

The testing of semiconductor chips in general is a very complex task because test devices must be fine enough in order to be coupled to the enormous number of chip signal input/output pins which are available to test the chip with a given test scheme.

Current and next generation semiconductor product chips have an increasingly large number of signal I/O stages to achieve the performance and complexity requirements imposed by the specific technical progress intended with each new generation. This trend, in conjunction with the required high quality of the products, results in the need for very costly test equipment to reach all of the signal input/output stages at the tester in order to have the stages tested adequately.

'Adequate testing' means to enable for full parametric testing of the physical drive/receive capabilities of the driver/receiver system of an I/O stage. It should be noted that this is far more than the self-test facilities being implemented on-chip in prior art, as for example disclosed in U.S. Pat. No. 5,541,935, or in an exemplary I/O stage as depicted in FIG. 1, which will be discussed later below.

The 'drive capability test' basically means to give an answer to the question if a driver device has the physical (i.e. electrical) properties required for driving a desired voltage level reflecting one of the three states, i.e. low, high and high-impedance state, abbreviated herein as HZ-state, from the driver stage input to its output. In particular, testing the parametric specifications of a driver device consists of testing the resistance of the transistor device in pass mode, as well as in lock mode.

The receive capability of the receiver stage is essentially determined by whether the receive hysteresis has specified threshold levels LPUL (Least Positive Up Level for '0') and MPDL (Most Positive Down Level for '1') which can be realized during normal operation of the stage. If the respective latch stores a '1' and the value shall be overwritten to '0', a voltage level must be applied at its input which is smaller than the MPDL because of the hysteresis problem being present in this situation. On the other hand, if the latch stores a '0' which shall be overwritten to '1', an input voltage is required which is at least greater than LPUL. Thus, 'full parametric testing' means to qualify a respective driver/receiver stage to determine if (and to quantify, in particular, how good) the drive and receive processes can be achieved with an I/O stage.

The above mentioned test equipment required for full parametric testing is large and expensive. In particular, the coupling between test apparatus and chip is difficult because of the enormous number of I/O stages to be tested. Nearly each new chip generation requires a new expensive test apparatus in particular to test the quality of the I/O stages.

In order to simplify the full parametric chip testing a method was introduced, the so-called "reduced pin test method". The basic idea used in this prior art approach is to couple an intermediate, connective device having a reduced number of pins between the test apparatus and the chip to be tested. The testing scheme was then a 'structurized scheme', i.e. a scheme in which a selectively chosen subset of chip signal I/Os connected to a low pin count test apparatus and a specific set of test patterns, applied only to this test I/O interface was decided to be sufficient to test the respective chip and in particular by having the unconnected signal I/Os testing themselves by receiving their own driven value.

A prior art I/O stage is illustrated below with reference to FIG. 1. FIG. 1 shows a simplified scheme of a prior art bi-directional signal I/O stage 10 having a built-in 'digital' self-test feature by which minimum qualitative properties of driver 18 receiver 24 system can be tested by driving both values '0' and '1' to node 14 (generally a connective pad denoted as PAD in the figures), and by receiving it correspondingly in receiver 24 and signal line 26 RDATA.

This kind of self-test, however, is of limited coverage as mentioned above with reference to U.S. Pat. No. 5,541,935, because it does not tell anything about the 'analog', i.e. the electrical properties of the I/O stage (the driver and receiver capabilities, DC-Ohm or AC-impedance, and hysteris behavior) as it will be described later below. Thus, applying this kind of built-in self-test, the driver as well as the receiver part can not be fully tested against the parametric specifications of the I/O stage like drive capability and/or receiver threshold levels.

I/O stage 10 further consists of signal line 12 DDATA as a signal input representing the logical data value ('0' or '1') which has to be driven out by driver logic 18 to node 14 denoted as PAD as the off-chip connection thereof. Signal line 16 carries a signal denoted as ACT which is the signal input used for ACTivating and turning off the driver when signal I/O stage 10 has to be in receive mode. P-type 20 and N-type 22 output stage field effect transistors, referred to herein and denoted in the drawing as P and N (FETs) are connected to node 14 PAD.

The P and N transistor devices depicted in FIG. 1 are illustrated in a simplified manner in order to improve clarity. In reality, each device 20 and 22 consists of a number of single transistors of the I/O stage, which is in turn often called an 'I/O book'.

Receiver device 24 denoted as 'rec' converts the voltage levels applied at node 14 PAD to logical '0' and '1' values at signal line 26 denoted as RDATA which is usually stored into a latch for further test evaluation but could also be carried out in a different way to the test apparatus. For simplification of the following disclosure it will be assumed that rec 24 already contains a latch function to store the test result.

Having implemented the limited self-test capability mentioned above, signal I/O stage 10 receives its own driven output signal. In this situation the off-chip connection PAD has no loading applied so that driver logic 18 may achieve the receiver threshold levels LPUL (Least Positive Up Level for '0') and MPDL (Most Positive Down Level for '1') too easily, which may result in undertesting. Further, a defect mis-aligning the detection levels of receiving stage 24 can rarely be found in the receiver area which may result in undertesting, as well.

As can be appreciated now by a person skilled in the art, due to the problems mentioned above there is a need to have all signal I/O stages connected to the above mentioned external test system in order to enable the testing for the full parametric specifications of drive and receive capability.

As mentioned in the prior art, the parametric drive capability test can be tested only with the external load connected to PAD in FIG. 1 provided by expensive external test circuitry. Without such external test circuitry, however, no test of the parametric specifications of the driver/receiver system can be performed, neither for chips constructed compatible to reduced pin technology nor for chips being incompatible with it.

BRIEF SUMMARY OF THE INVENTION

It is thus an object of the present invention to improve the testing of driver and that of receiver stages, and in particular that of combined stages, and in particular that of semiconductor chip I/O stages.

Although the present invention has a very broad scope implied by its inherent technical abstractness, it will be discussed in here primarily with reference to bi-directional chip input/output (I/O) stages, since this is the most obvious technical area to apply the present invention and to draw significant technical and economical advantages immediately from it.

According to its broadest aspect, the present invention provides for a method and the respective hardware implementation for full parametric testing of the drive capability of a driver stage and the receive capability of a receiver stage implemented in an integrated circuit chip, which is characterized by the step of determining electrical properties (ie. DC-resistance, AC-impedance) of a driver stage by at least one test load implemented on the chip itself. For accomplishing this, the test load is selectively controllable according to a predetermined on-chip test scheme for forming a voltage divider circuit in which the test load causes a characteristic voltage drop usable for test evaluation. With this approach, a full parametric driver and receiver self-test can be achieved without the need of an external tester connection to the off-chip contacting pad. The test result is converted into digital form and can be used to draw quantified conclusions about the operational performance of the driver/receiver stage. Thus, any expensive off-chip test scheme is eliminated.

According to a preferred aspect of the present invention, the present invention provides for a method and the respective hardware implementation for full parametric testing of the drive capability of a driver stage and the receive capability of a receiver stage of a bi-directional combined driver/receiver stage, the driver stage consisting of a first number of '0' driving transistor devices, and a second number of '1' driving transistor devices. The subgroup is advantageously chosen such that the fraction obtained by the "subgroup" divided by the "total" is significantly different from 50%, a feature which is further to be referred to as 'asymmetric control', or 'asymmetric voltage divider'. The method consists of the steps of: a) selectively controlling a subset of the first number of transistor devices for forming a respective test load for the total of the second number of transistor devices, b) generating an evaluable input voltage at a receiving device of the receiver stage reflecting the drive capability of the total of the second number of transistor devices, c) selectively controlling a subset of the second number of transistor devices for forming a respective test load for the total of the first number of transistor devices, and d) generating an evaluable input voltage at the receiving device of the receiver stage reflecting the drive capability of the total of the first number of transistor devices.

Because of the 'split' output stage devices, a very high precision for accurate V PAD (pad voltage) level adjustments can be achieved in comparison to an analog control.

There is no need for additional, space consuming load devices; the output stage devices of P-, and N-type, respectively, are split into at least two sub-devices P1, P2 and N1, N2. Thus, they are re-used for test purposes when being controllable separately.

The test scheme is simple and is applied via the test signal I/O's.

The test can be applied at low speed. There is no need for high performance test equipment.

The test can be applied at every packing level: at wafer level, on a single-chip module (SCM) or on a temporary chip attach (TCA), on a multiple chip module (MCM), and even at system level, when the chip is incorporated into a printed circuit board connected to whatever bus system. In the latter case, advantageously a dedicated piece of system software can be executed which controls the hardware logic according to the test scheme so as to perform the inventive test method. The software may be run triggered by service staff or in any automated form.

For implementing the inventive logic adequate to modern chip design, the first number of transistor devices advantageously consists of P-type transistors and the second number of transistor devices consists of N-type transistors, or vice versa, respectively.

The above method can advantageously be applied to situations in which the driver/receiver stage is an input/output (I/O) stage of a chip. But the inventive concept is free to be accomodated to test for an output-only stage of a chip, as well. For this purpose, the voltage level serving as a test result has to be read and evaluated by a separate signal line, instead of the already existing receiving line in the case of the combined I/O case.

As should be appreciated by a person skilled in the art, the basic concept of the present invention consists of the idea to setup, i.e. to establish a controllable 'on-chip loading', for each signal I/O stage so that the driver as well as the receiver can be tested against the full parametric specifications without a tester pin connected to the external, connective node.

Basically, this can be achieved by adding a load device on the chip and controlling it accordingly by separate control inputs. Advantageously, however, this is achieved by re-using the transistor devices of the driver devices which are already present in the I/O stage as a voltage divider for asymmetrically testing a subgroup of the P-device transistors against the total of the N-device transistors, and vice versa.

In particular, the inventive principle can be summarized as follows. The N-type and P-type devices of the driver output stage are logically split into two separate sub-devices P1, P2 and N1, N2, respectively. Both sub-devices, or sub-groups of transistors are arranged to be controlled separately by respective control inputs SELFTEST and ACT signals.

Further, a simple control logic is implemented which controls the above-mentioned device and sub-device such that the P-subdevice acts as a load for the N-device and vice versa.

A preferred dimensioning of the output stage devices' resistance and thus of the selection of the degree of asymmetry is as follows. P1P2/N2=(VDD-VH)/VH, i.e., the total resistance of P1 and P2 (electrically connected in parallel) divided by the resistance of the N2 subgroup is the same as the voltage difference between VDD and VH divided by VH.

This relationship is defined in conjunction with the input detection level specification LPUL of the receiving device rec 24 plus some guardband and P2/N1N2=(VDD-VL)/VL, respectively.

BRIEF DESCRIPTION OF THE SEVERAL VIEWS OF THE DRAWINGS

The present invention is illustrated by way of example and is not limited by the shape of the figures of the accompanying drawings in which.

DETAILED DESCRIPTION OF THE INVENTION

Description of the Preferred Embodiment

Figure 1:
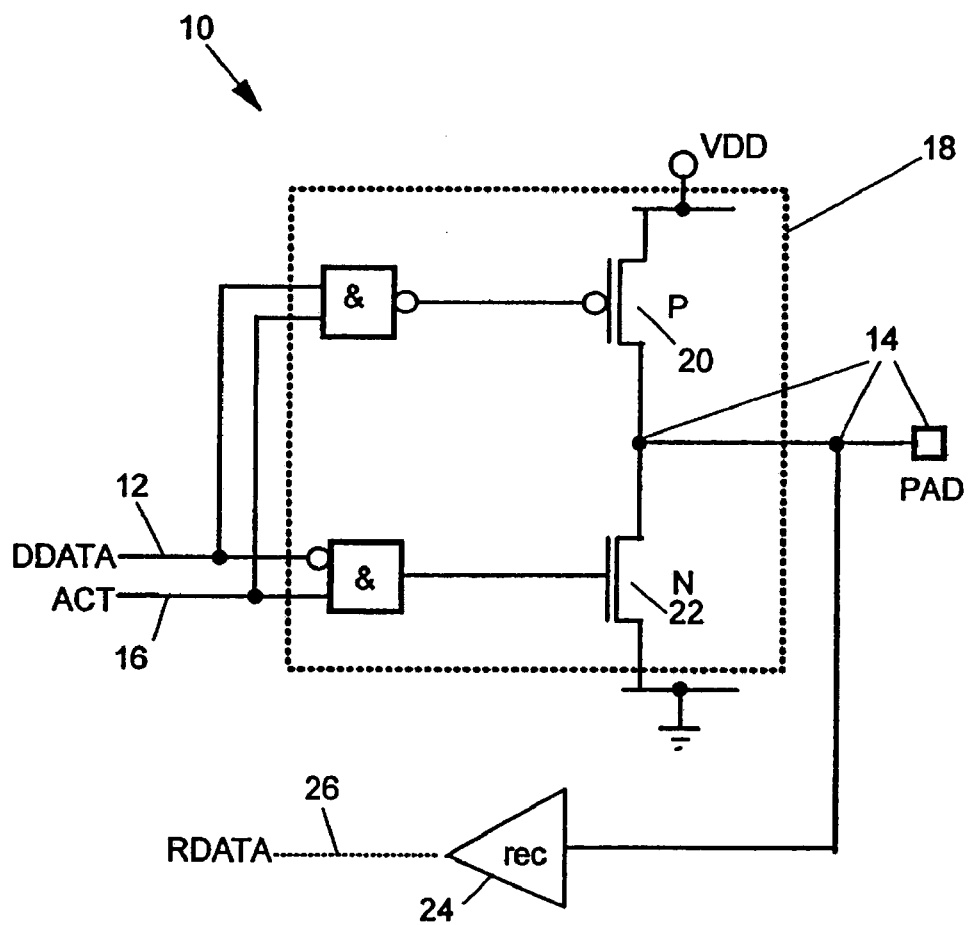
FIG. 1 is a simplified schematic logical representation of an exemplary implementation of a prior art bi-directional signal Input/Ouput stage.
Figure 2:
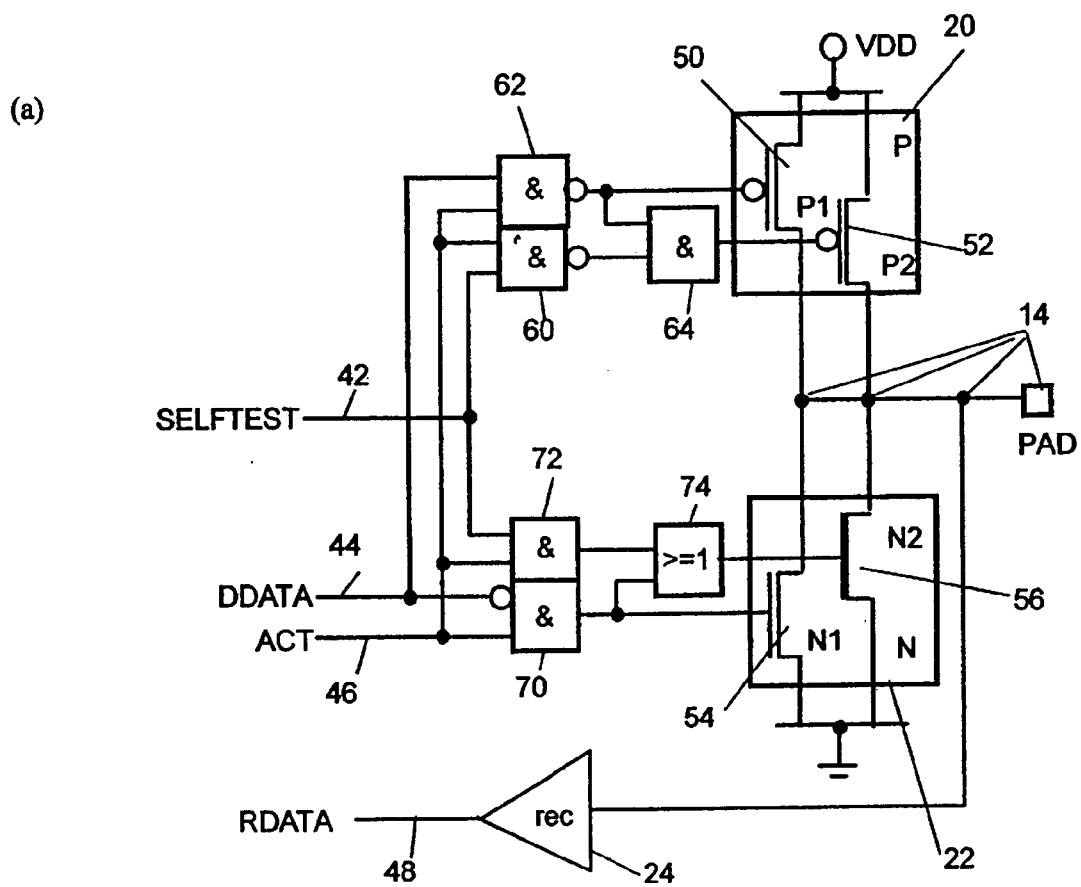
FIG. 2 is a simplified schematic logical representation of an exemplary implementation of a combined Input/Output stage with integrated self-test facility by split, asymmetric controlling the semiconductor devices according to a preferred embodiment.
Figure 2:
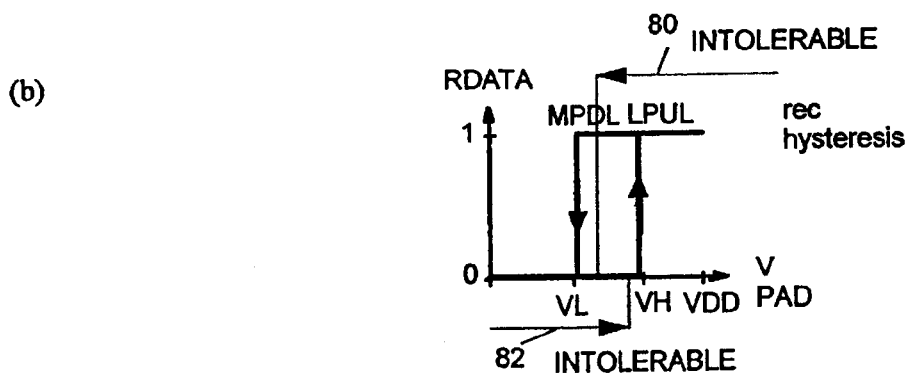

With reference to FIG. 2(a), an exemplary implementation of a combined input/output-stage consists of four relevant signal lines: SELFTEST line 42, data input line DDATA 44, ACTivation line 46 and receive data line RDATA 48. P-device 20 of FIG. 1 is now split up into two different subgroups of transistor devices, P1, P2 having reference signs 50 and 52, respectively. The two different subgroups 50, 52 are depicted in a simplified form as well and can be separately controlled by a logical combination derived from the three signal lines SELFTEST 42, DDATA 44 and ACTivation 46.

Basically the same is done with N-device 22 which is similarly split up into two N-device subgroups 54 and 56 which can also be separately controlled by respective control lines connected to the gate terminals of each transistor consisting of each subgroup.

In particular, the logical scheme for controlling the P-device subgroups 50 and 52 is as follows. Self-test signal 42 is fed into AND-gate 60. Activation signal 46 is fed both to AND-gate 60 and to second AND-gate 62. The second input for AND-gate 62 is data input signal 44 to be driven at output PAD 14. The output signal of both AND-gates 60, 62 are inverted. The output signal of AND-gate 62 is first fed as a control signal to the gate terminal of each P1 transistor. In order to improve the clarity of the drawing, P1 and P2 subgroups are each represented in a simplified form.

Inverted AND-gate 62 output is fed into a further AND-gate 64, together with the inverted output of AND-gate 60. The output of AND-gate 64 is fed into the gate terminal of P2-devices 52.

The lower branch representing the logical combination of how to control N1 and N2 subgroups 54 and 56, respectively, are structured in an analogous form as described above. DDATA input line 44 signal, however, is inverted before being entered into AND-gate 70. Further, the second input into AND-gate 70 is activation signal 46, which is also fed into AND-gate 72. The second input for AND-gate 72 is self-test signal 42. The output of AND-gate 70 and 72 is fed into AND-gate 74 and the resulting output signal is fed as a control signal to the gate terminal of the N2 subgroup of transistor devices. The N1 subgroup of transistor devices is controlled by the output of AND-gate 70.

P- and N-devices 20 and 22, respectively, are operated between supply voltage VDD and ground potential. A number of tapping nodes 14 are implemented between the drain terminals of the P-devices and the source terminals of the N-devices. At nodes 14 the same voltage level can be tapped and fed as an input signal into receiving device 24 consisting of a master-slave flip-flop for storing its input state.

The switching scheme occurs as follows:

If Selftest=1 and ACT=1, then P2 and N2 are always 'ON' acting as load for the respective complementary device.

If Selftest=0 the circuitry works as a standard driver.

In Selftest Mode (Selftest=1) the resulting asymmetric voltage divider causes an input voltage VH at the receiver 24 'rec' which is close to but above LPUL for the receiver for DDATA=1, and VL which is close to but below MPDL for DDATA=0, whereby the initial state on signal line 44 DDATA must always be the opposite.

In case of a defect within the driver as well as the receiver, the above described conditions will not be achieved and the resulting logic value on RDATA will mismatch with the expected data.

According to the above described switching scheme, the following logical values are expected according to the present invention to be realizable at the respective terminals:

TABLE 1

|  | 1 | 2 | 3 | 4 | 5 | 6 |
|---|---|---|---|---|---|---|
| ACT | 0 | 0 | 1 | 1 | 1 | 1 |
| SELFTEST | 0 | 1 | 0 | 0 | 1 | 1 |
| DDATA | x | x | 0 | 1 | 0 | 1 |
| V PAD | float | float | ~0V | ~VDD | VL | VH |
| RDATA | x | x | 0 | 1 | 0 | 1 |

The upper portion of Table 1 shows six different input signal sequences for ACT, SELFTEST and DDATA, whereby an x-value for input means 'non-relevant' and for output means 'undefined'.

Thus, the input state sequences are: 00x, 01x, 100, 101, 110 and 111.

As can be seen from Table 1, the resulting output states V PAD and RDATA are as follows: float/x, float/x, ~0V/0, VDD/1, VL/0, and VH/1.

The sequence of output states can be obtained when the following pattern application sequence is applied, provided the device under test is tested as 'tolerable': first, the input line DDATA 44 is set to '1' in the upper portion leading to the P-devices and to '0' in the bottom portion leading to the N-devices. Thus, a so-called skewed load is obtained.

The self-test signal is initially equal to '0'. A self-test signal of value '0' means that the device is in operation mode and not in test mode.

With these input states, the third and fourth column of Table 1 are realized. When DDATA is '0' then a voltage of about 0 Volts results at node PAD 14. Consequently, RDATA stores a value of '0'. Then DDATA is toggled to '1' as shown in the fourth column. In this case a voltage V PAD of about VDD, i.e. the supply voltage, is obtained at node 14 and latch 24 is overwritten with the value '1'. This is the status which should be realized in order to begin the actual test. The actual test is illustrated with columns 5 and 6, respectively, in Table 1. Self-test signal 42 is now switched to '1' and DDATA is set to '0'. Then a resulting voltage of VL can be tapped at PAD node 14.

When the device is evaluated as 'tolerable', the voltage VL is below MPDL which leads to overwrite the value stored in receiving latch 24. A new value is thus obtained therein: the value '0'. Otherwise, if a voltage level greater then VL plus some guard band is found at node PAD 14 then the voltage is too high and does not succeed to invert the value stored in receiving latch 24. The receiver hysteresis curve depicted in the upper right corner of FIG. 2 (*b*) for this case is depicted with arrow 80. In this case the former value of '1' stored in latch 24 would remain to be stored therein. As, however, a value of '0' is expected for a tolerable device, it can be concluded that the tested input/output stage does not satisfy the test requirements. Thus, for example, it can be excluded from the production chain.

When the test is successful, then RDATA must be forced again to a value of '0', for example, by applying the input state sequence of column 3, again. Then, the second portion of the test can be performed as described below.

As revealed from column 6 of Table 1, SELFTEST is again set to '1', but DDATA is now set to '1' instead of being set to '0' as it was in the case in the first portion of the test.

Now, for a tolerable device, a voltage VH should be obtained at node PAD 14 which is high enough to overwrite the value of '0' stored in receiver latch 24. With respect to the hysteris scheme shown in FIG. 2(*b*), a VH must be present which is greater then LPUL. If, however, the device issues a voltage which is smaller then VH, see the respective arrow 82, the device should be qualified as 'intolerable.'

In the foregoing specification, the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

For example, the inventive concept can also be used to test the parametric specification of the driver capability only, in a case in which a combined receiver test is not recommended. Or, the inventive concept can be modified in order to test only the receiver threshold levels, when a driver test is not recommended.

From the above description, the inventive asymmetric control of driver output stage devices yields a satisfying test scheme when the test is performed in the two portions as described above in which first, a first subgroup of N-devices is used as a load for testing the total of P-devices and second, a second subgroup of P-devices is used for testing the total of N-devices. Of course, P1 and N1 can also be used for generating a voltage drop instead of P2 and N2.

The present invention can be realized in hardware, software, or a combination of hardware and software. A test tool according to the present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software could be a general purpose computer system with a computer program that, when being loaded and executed, controls the computer system such that it carries out the methods described herein, in particular in the case when a test program is run at system level, i.e., in a computer which is already operated.

The present invention can also be embedded in a computer program product, which consists of all the features enabling the implementation of the methods described herein, and which, when loaded in a computer system, is able to carry out these methods.

Computer program means or computer program in the present context mean any expression, in any language, code or notation, of a set of instructions intended to cause a system having an information processing capability to perform a particular function either directly or after either or both of the following:

a) conversion to another language, code or notation;

b) reproduction in a different material form.

What is claimed is:

1. A method for fall parametric testing the drive capability and the receive capability of an input/output (I/O) stage implemented in an integrated circuit chip, comprising the step of:

determining electrical properties of the output stage by at least one test load implemented on the integrated circuit chip, wherein the test load being selectively controllable according to a predetermined on-chip test scheme for forming an asymmetric voltage divider circuit comprising a subset of a plurality of driving transistor devices, and wherein the test load causes a characteristic voltage drop usable for test evaluation.

2. The method according to claim 1 for testing of a bi-directional combined input/output (I/O) stage, the asymmetric voltage divider circuit comprising a first plurality of '0' driving transistor devices and a second plurality of '1' driving transistor devices, the method further comprising the steps of:

a) selectively controlling a subset of said first plurality of transistor devices for forming a respective test load for the total of said second plurality of transistor devices, b) generating an evaluable input voltage at a receiving device of said input stage reflecting the drive capability of the total of said second plurality of transistor devices, c) selectively controlling a subset of said second plurality of transistor devices for forming a respective test load for the total of said first plurality of transistor devices, and d) generating an evaluable input voltage at said receiving device of said input stage reflecting the drive capability of the total of said first plurality of transistor devices.

3. The method according to claim 2, wherein said first plurality of transistor devices comprises P-type transistors and said second plurality of transistor devices comprises N-type transistors, or vice versa, respectively.

4. A hardware chip comprising at least one test load implemented on-chip for determining electrical properties of an output stage, the test load being selectively controllable according to a predetermined on-chip test scheme for forming an asymmetric voltage divider circuit comprising a subset of a plurality of driving transistor devices in which the test load causes a characteristic voltage drop usable for test evaluation.

5. The hardware chip according to claim 4, comprising at least one bi-directional combined input/output (I/O) stage, the output-stage asymmetric voltage divider circuit comprising a first plurality of '0' driving transistor devices and a second plurality of '1' driving transistor devices, the chip farther comprising:

a) means for selectively controlling a subset of said first plurality of transistor devices for forming a respective test load for the total of said second plurality of transistor devices, and b) means for selectively controlling a subset of said second plurality of transistor devices for forming a respective test load for the total of said first plurality of transistor devices.

6. The hardware chip according to claim 5 having subdevices P1, P2, N1 and N2 of said output stage, wherein P1 and P2 have source terminals connected to VDD and drain terminals connected respectively to source terminals of N1 and N2, and N1 and N2 have drain terminals connected to ground, and further wherein an asymmetrically controlled output stage according to P1P2/N2 =(VDD−VN) / VH, and P2/N1 N2 =(VDD−VL)/VL, respectively, wherein:

P1 P2 is the parallel electrical resistance of corresponding sub-devices P1 and P2 of said output stage, N2 is the electrical resistance of corresponding sub-device N2 of said output stage, N1N2 is the parallel electrical resistance of corresponding sub-devices N1 and N2 of said output stage, P2 is the electrical resistance of corresponding sub-device P2 of said output stage, VDD is a power supply voltage, and VH and VL are said characteristic voltage caused by said output stage.

7. The hardware chip according to claim 4, wherein the chip is used in a printed circuit board.

8. A computer program product for execution in a data processing system comprising computer program code portions for performing respective steps of a method for frill parametric testing the drive capability and the receive capability of an input/output (I/O) stage implemented in an integrated circuit chip, the method comprising:

determining electrical properties of the output stage by at least one test load implemented on the integrated circuit chip, wherein the test load being selectively controllable according to a predetermined on-chip test scheme for forming an asymmetric voltage divider circuit comprising a subset of a plurality of driving transistor devices, and wherein the test load causes a characteristic voltage drop usable for test evaluation.

9. A computer program product stored on a computer usable medium comprising computer readable program code portions for causing a computer to perform a method for full parametric testing the drive capability and the receive capability of an input/output (I/O) stage implemented in an integrated circuit chip when said computer readable program code portions are executed on the computer, the method comprising:

determining electrical properties of the output stage by at least one test load implemented on the integrated circuit chip, wherein the test load being selectively controllable according to a predetermined on-chip test scheme for forming an asymmetric voltage divider circuit comprising a subset of a plurality of driving transistor devices, and wherein the test load causes a characteristic voltage drop usable for test evaluation.

* * * * *